United States Patent
Haetty

(10) Patent No.: US 7,259,579 B2
(45) Date of Patent: Aug. 21, 2007

(54) METHOD AND APPARATUS FOR SEMICONDUCTOR TESTING UTILIZING DIES WITH INTEGRATED CIRCUIT

(75) Inventor: Jens Haetty, Essex Junction, VT (US)

(73) Assignee: Infineon Technologies AG, Munich (DE)

( * ) Notice: Subject to any disclaimer, the term of this patent is extended or adjusted under 35 U.S.C. 154(b) by 84 days.

(21) Appl. No.: 11/060,737

(22) Filed: Feb. 18, 2005

(65) Prior Publication Data

US 2006/0186907 A1    Aug. 24, 2006

(51) Int. Cl.
*G01R 31/02* (2006.01)

(52) U.S. Cl. ............... 324/756; 324/763; 324/765

(58) Field of Classification Search ............ None
See application file for complete search history.

(56) References Cited

U.S. PATENT DOCUMENTS

| | | | |
|---|---|---|---|
| 6,401,224 B1 * | 6/2002 | Schoniger et al. | 714/718 |
| 6,734,695 B2 * | 5/2004 | Schaffroth et al. | 324/765 |
| 6,744,271 B2 * | 6/2004 | Baker | 324/763 |
| 7,034,559 B2 * | 4/2006 | Frankowsky et al. | 324/763 |
| 7,054,222 B2 * | 5/2006 | Li et al. | 365/233 |
| 2005/0110511 A1 * | 5/2005 | Gabara et al. | 324/763 |

* cited by examiner

*Primary Examiner*—Minh N. Tang
(74) *Attorney, Agent, or Firm*—Edell, Shapiro & Finnan, LLC

(57) ABSTRACT

A method and apparatus for testing semiconductor wafers in which certain contact areas of dies not used in the testing and required to be at a predetermined voltage during testing are connected to the predetermined voltage via an integrated circuit in the die.

16 Claims, 4 Drawing Sheets

METHOD AND APPARATUS FOR SEMICONDUCTOR TESTING UTILIZING DIES WITH INTEGRATED CIRCUIT

FIELD OF THE INVENTION

The invention is directed to a method and apparatus for electrically testing semiconductor wafers.

BACKGROUND OF THE INVENTION

In the manufacture of semiconductor devices, a semiconductor wafer is divided by scribe lines into a plurality of dies. The dies comprise integrated circuits of identical type and, after appropriate testing to verify operability and reparability of the individual dies, they are sawed from the wafer and are thereafter referred to as chips. Each chip is appropriately packaged to result in the completed semiconductor device.

Each die has a plurality of contact areas, which are typically referred to as pads. In the completed semiconductor device, such pads are connected to leads which are accessible via the device packaging. During electrical testing of the wafer, individual contact areas are contacted by respective testing probes of a probe card. Such probes are typically needle-like elements mounted on a probe card structure, which are aligned with the contact areas before actual contact is made. The needle-like devices penetrate slightly into the contact areas to make electrical contact. There are probe types other than needle-like devices which may be used with various types of pad structures, but the present invention is not dependent on the particular type of contact area or probe which is utilized.

For functional testing, dedicated automated test equipment (henceforth referred to as "IC test system") is connected to the probe card and voltages are applied through the probes to various contact areas of the wafer. Basic chip operation usually requires a minimum of three types of pads: (1) pads through which a global supply voltage $V_S$ is applied, (2) pads that are used to control the command logic of the integrated circuit, and (3) pads that are used to supply data bits to and receive data bits from the chip. Those return signals from the wafer also pass through designated probes and are fed back to the electrical tester. The location of test failures is stored in a fail memory so that repairs can be kept track of, and the testing sequence is controlled automatically.

A probe card may be designed so that its probes cover multiple dies in order to maximize the number of dies can be tested at the same time. The degree to which multiple dies can be tested simultaneously is referred to as parallelism. Each probe is ultimately connected to the electrical tester, and corresponds to a channel of the testing system. Since the factors limiting parallelism are the capacity of the fail memory and the number of available testing channels per device under test, it is desirable to maximize the number of channels which are available for testing.

Typically, less than all of the contact areas on the dies are utilized for testing, and it may be a requirement of the test that one or more of the contact areas which is not tested be held at a predetermined voltage value during the test. In accordance with a prior mode of accomplishing this, the predetermined voltage value was obtained through the probe card, and since any probe(s) used for obtaining such value could not be used for testing, a limitation on the number of testing channels resulted.

SUMMARY OF THE INVENTION

In the present invention, in the electrical testing of semiconductor wafers containing multiple dies each of which has a plurality of contact areas which are contacted by respective probes of a probe card connected to test equipment during the testing, each die has one or more certain contact areas which are not utilized in the testing, and a method is provided which comprises electrically connecting at least one of the certain contact areas to voltage of predetermined value via circuitry which is integrated in the die in response to a predetermined signal.

BRIEF DESCRIPTION OF THE DRAWINGS

The invention will be better understood by referring to the accompanying drawings wherein.

DESCRIPTION OF THE PREFERRED EMBODIMENTS

Figure 1:
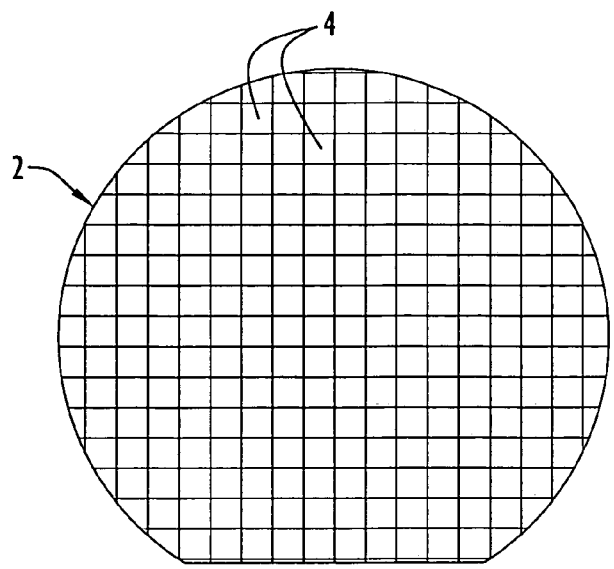
FIG. 1 is a plan view of a semiconductor wafer.

FIG. 1 is a plan view of semiconductor wafer 2 which is divided by scribe lines into a number of dies 4. Each die 4 is a complete integrated circuit known as a chip after the individual dies are cut from the wafer.

Figure 2:
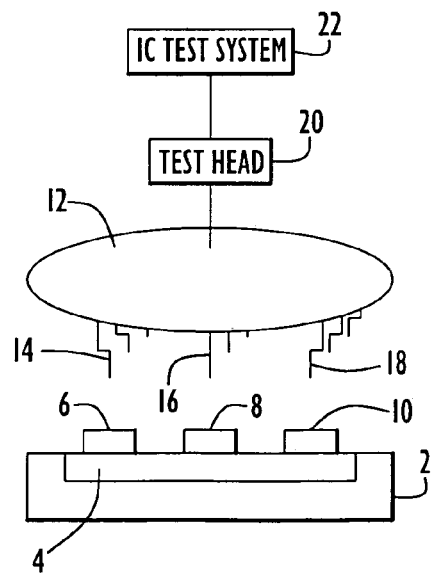
FIG. 2 is a schematic drawing of a prior art system for electrically testing a semiconductor wafer.

The dies typically undergo electrical testing for defects before they are cut from the wafer. A system for performing such electrical testing is schematically depicted in FIG. 2. Wafer 2 is shown along with only a single one of the many dies 4 for purposes of illustration. Each die 4 typically has many contact areas to which leads may be attached in the completed semiconductor device. For purposes of illustration, only three such contact areas 6, 8, and 10 are shown in FIG. 2.

The probe card is connected to IC test system 22 and such connection may be made through a test head 20. The test system 22 is automated and successively applies test voltages to the contact areas and receives return signals. The location of defects may be stored as pass/fail information in dedicated fail memory boards in the IC test system; this information is then commonly used to repair the chip after the completion of functional testing.

Typically, not all of the contact areas are used in the test procedure, and it may be a requirement that one or more of such areas which are not used be tied to a predetermined voltage value during the test. The term "value" is used herein in a broad sense and includes a voltage of fixed magnitude, ground potential, as well as a time-varying voltage pattern.

Figure 3:
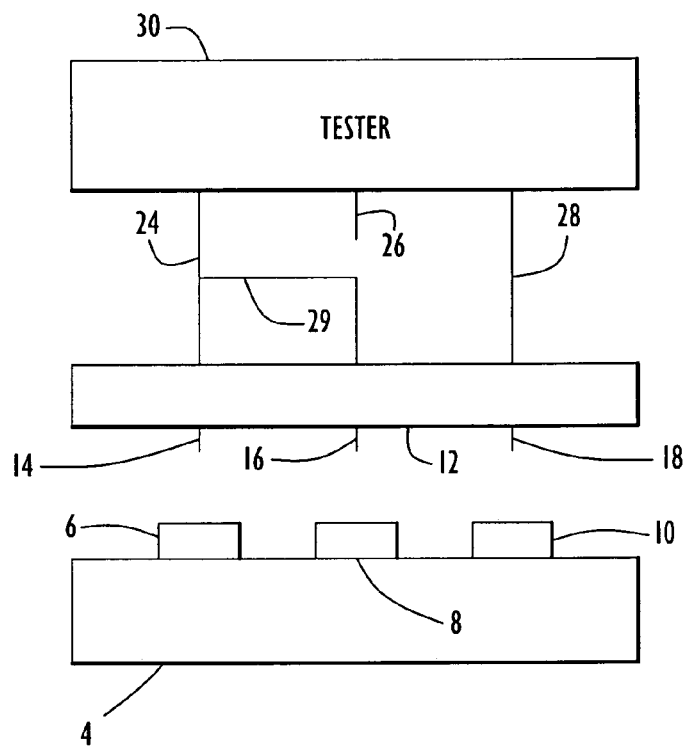
FIG. 3 is a schematic drawing of a prior system for electrically testing a semiconductor wafer.

In a prior system, it was a requirement that two of the contact areas be at the same fixed voltage value during testing, which was the supply voltage value applied to one of the two contact areas for normal chip operation. In order for both of the contact areas to be at this voltage value, the two contact areas were coupled to each other through the probe card in that the corresponding probes were electrically coupled in the probe card structure itself. FIG. 3 shows essentially the same system as FIG. 2 with the electrical tester 30 incorporating both blocks 20 and 22 of FIG. 2. In FIG. 3, it is contact areas 6 and 8 which are coupled together through the probe card, and this is represented by conductor 29 in FIG. 3. Thus, when the required voltage value was applied to contact area 6 as in normal operation, both contact areas 6 and 8 would be at this value. It is apparent that a disadvantage of the system shown in FIG. 3 is that a testing channel is used up to apply a required voltage value, and thus such channel cannot be used for testing purposes.

Figure 4:
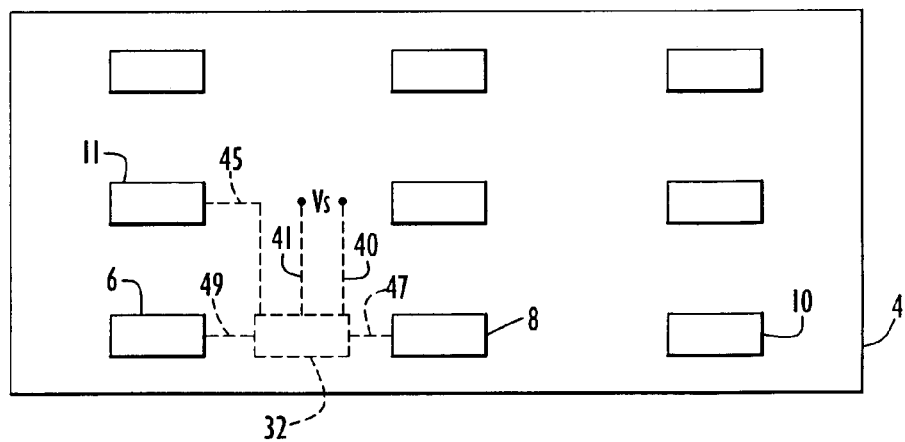
FIG. 4 is a plan view of a semiconductor die incorporating an embodiment of the present invention.
Figure 5:
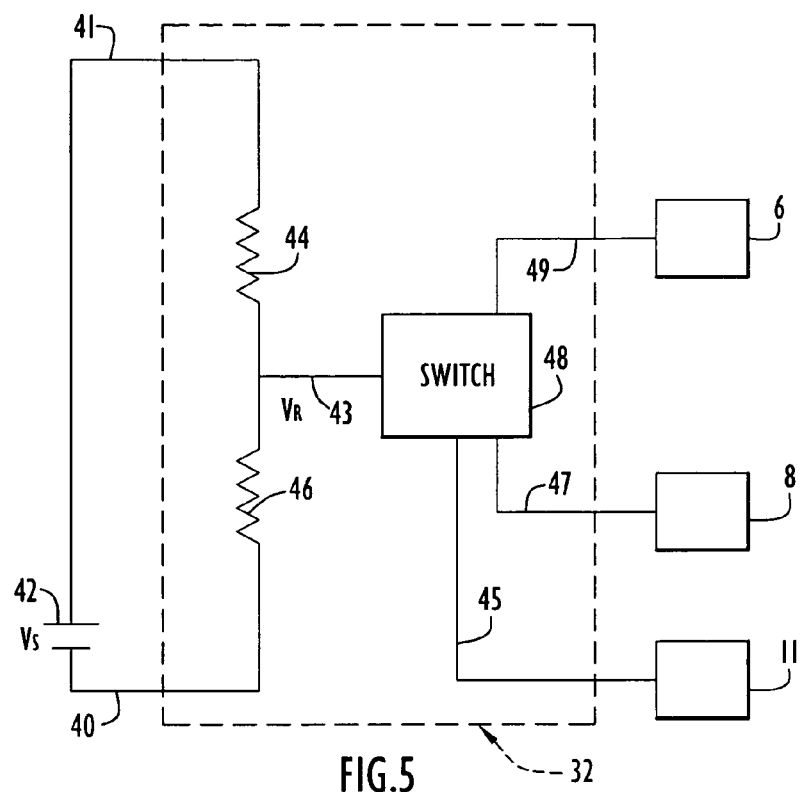
FIG. 5 is an electrical schematic of an integrated circuit which comprises an embodiment of the present invention.

An embodiment of the invention is shown in FIGS. 4 and 5. FIG. 4 is a plan view of a die, which for purposes of illustration, shows less than all of the contact areas which would likely be present on an actual die. Contact areas 6, 8, and 11 are depicted, as is integrated circuit 32 which is part of the die. The inputs to the integrated circuit 32 are contact area 6, contact area 8, contact area 11, and voltage $V_S$ applied through conductors 40 and 41.

Figure 6:
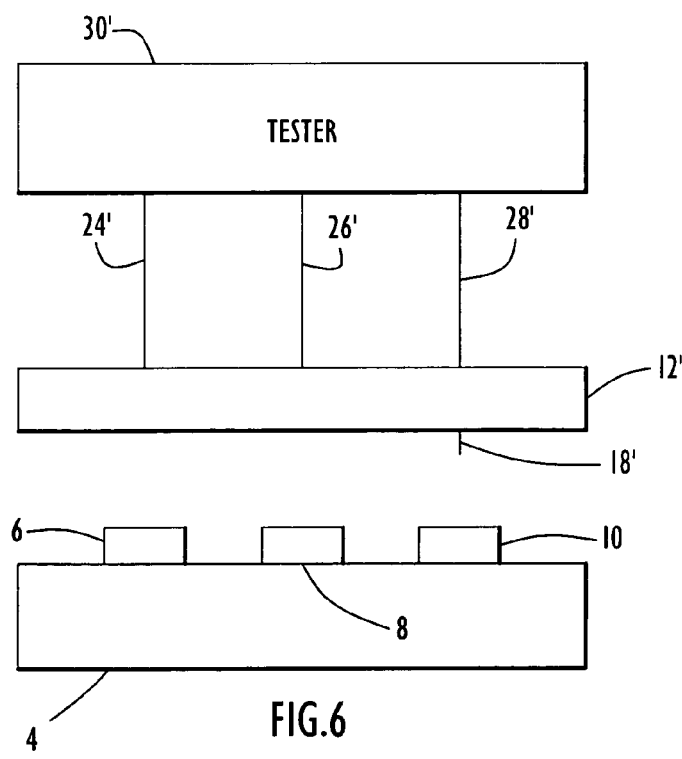
FIG. 6 is a schematic diagram of an electrical testing system for a semiconductor wafer which may incorporate an embodiment of the invention.

FIG. 5 may serve as an electrical schematic of the integrated circuit 32, which can be easily implemented by one skilled in the art. The circuit is comprised of a voltage divider made up of resistances 44 and 46, and switch 48. A supply voltage of value $V_S$ is connected to the voltage divider by conductors 40 and 41. Inasmuch as resistances 44 and 46 are of equal resistance, a desired voltage $V_R$ is available at the junction of the resistors. The inputs to switch 48 are the voltage $V_R$ and contact areas 6, 8, and 11. The trigger for switch 48 is a predetermined signal on contact area 11, for example, the forcing of contact area 11 to ground potential through a testing probe. The switch is configured, so that upon receipt of the trigger, conductors 43, 47, and 49 are connected to each other, thus coupling contact areas 6 and 8 together and to the voltage $V_R$. Hence, the same result is accomplished as in the prior arrangement of FIG. 3, but a testing channel is saved. This is illustrated in FIG. 6 which is similar to FIG. 3, but where it is seen that coupler 29 is not present, and testing probes are not present over contact areas 6 and 8. Thus, testing channels 24' and 26' can be connected up with probes having different locations on the die. For example, they can be located over contact locations on a different die thus increasing the parallelism at which testing can be performed. This leads to a cost advantage in wafer testing. Alternatively, the additional channels can be used to test additional contact locations on the same die, thus increasing the available test information. Since the probe cards are typically custom designed for specific chips, a new probe card with a new probe configuration may be implemented. If the probe card is of a type where the probes are movable, it is possible that the same probe card can be re-configured. If, in the embodiment of FIG. 3, each channel 24 and 26 had been independently connected to probes 14 and 16 respectively to apply the voltage (no coupler 29) two channels would be saved rather than one.

The resistances 44 and 46 may be dedicated resistance integrated circuit portions or they may be part of other components. A resistance type voltage divider is illustrated since it is the most common, but any other type of voltage divider may be used and is within the scope of the invention. The function of the circuit of FIG. 5 could also be performed by a circuit utilizing two switches, one having contact area 6 inputted, the other having contact area 8 inputted, and both switches having the voltage $V_R$ and contact area 11 inputted. Such a switch would connect each of contact area 6 and contact area 8 to voltage $V_R$ and is within the scope of the present invention. However, the circuit would not be as desirable as that shown in FIG. 5 because it would consume more space on the die. Additionally, it should be appreciated that while FIGS. 4 and 5 show an embodiment where two contact areas are connected to a voltage value required for testing, the invention encompasses connecting any number of contact areas to a voltage value including only a single contact location. To couple more than two contact locations together, the voltage divider shown in FIG. 5 may be configured of a greater number of legs. While in the embodiment depicted the same voltage value is connected to both contact areas, the circuit may be arranged so that the values of the voltages are different.

Figure 7:
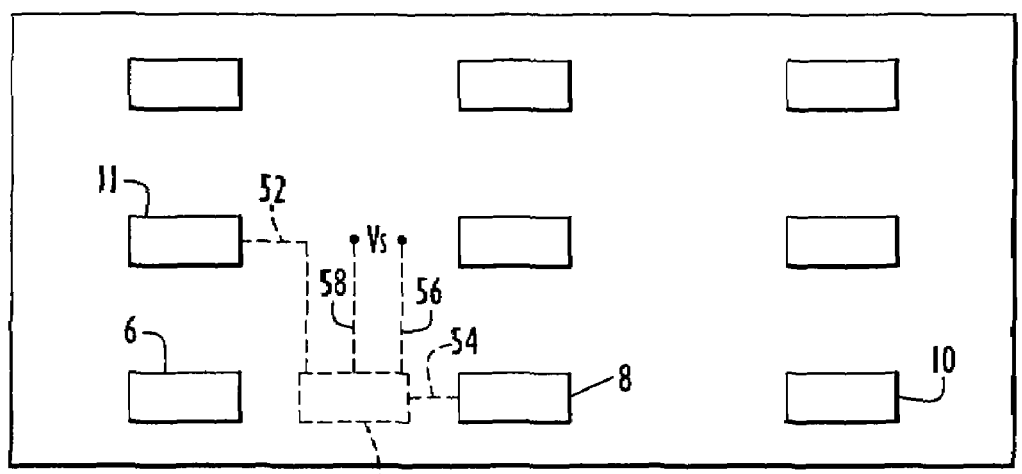
FIG. 7 is a plan view of a semiconductor die incorporating a further embodiment of the invention.
Figure 8:
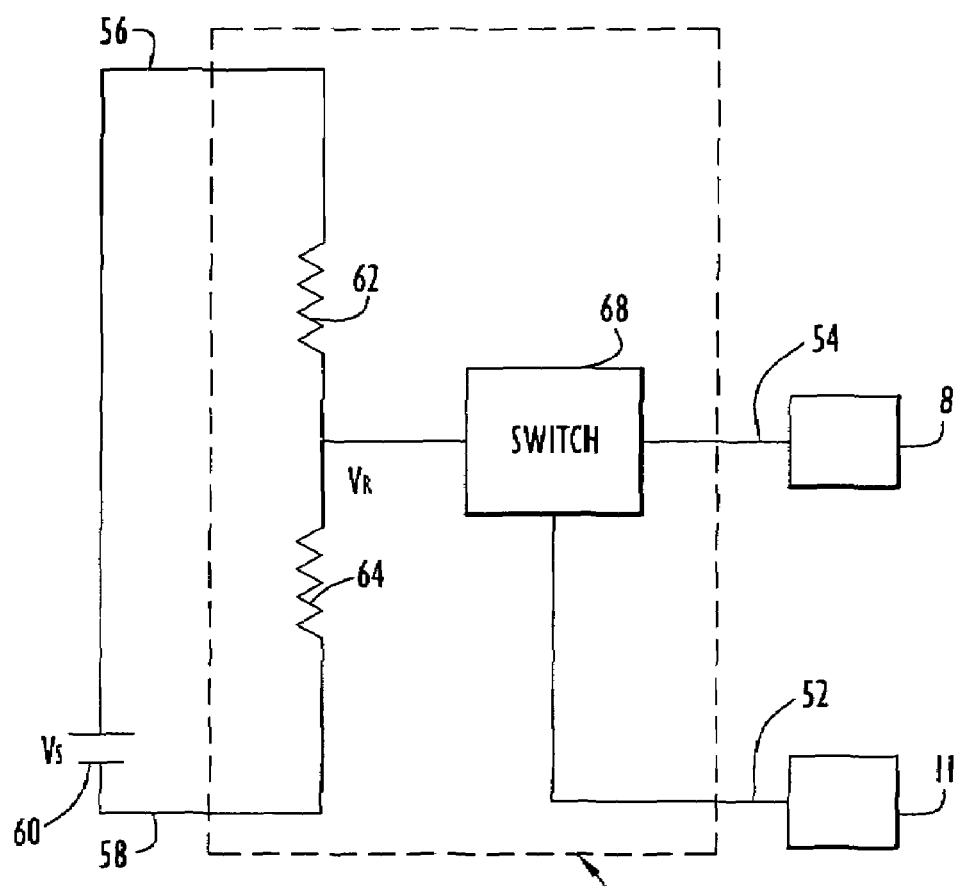
FIG. 8 is an electrical schematic of an integrated circuit which comprises a further embodiment of the present invention.

FIGS. 7 and 8 depict an embodiment of the invention where the single contact area 8 is connected to $V_R$ through integrated circuit 50 which is embodied in the die 4. Referring to FIG. 7, the inputs to integrated circuit 50 are the voltage source $V_S$ contact area 8 and contact area 11. Referring to the schematic of FIG. 8, it is seen that integrated circuit 50 may be comprised of a voltage divider made up of resistors 62 and 64, and switch 68. In the operation of the circuit, when a trigger is received on contact area 11, the switch 68 connects the contact area 8 to the voltage value $V_R$. The contact area 11 is connected to the switch 68 by conductor 52 while the contact area 8 is connected to the switch 68 by the conductor 54. The voltage source $V_s$ is connected to the integrated circuit 50 by conductors 56 and 58.

The invention may be utilized in testing many different types of integrated circuits. An example is DDR (double data rate—includes DDR1, DDR2 and subsequent generations, if any) SDRAM (static dynamic random access memory). In such a device, the BCLK and VREF pads, which respectively have clock and voltage reference functionality, are not used in the wafer-level testing but are merely required to be held at VDD/2 during testing where VDD is the chip supply voltage (previously referred to as "$V_s$"). The chip also has a BIST (built in self-test) pad. Thus, the present invention would be utilized to connect VREF and BCLK together through the integrated circuit and both to VDD/2 upon the BIST pad being forced to ground. This also may be the trigger for other channel saving implementations. A test mode may not be employed, as this would cause VRLEF and BCLK to float between power-up and test mode set, with potentially adverse effects for chip functionality.

It should be understood that while the invention has been described in detail and with reference to specific embodiments thereof, it will be apparent to one skilled in the art that various changes and modifications can be made therein without departing from the spirit and scope thereof. Accordingly, it is intended that such modifications and variations of the invention be covered provided they come within the scope of the appended claims and their equivalents.

What is claimed is:

1. A semiconductor die having a plurality of contact areas which are in electrical connection with an electrical tester via a probe card during electrical testing of the die and one or more certain contact areas which are not in electrical connection with the electrical tester at a time during which electrical testing is performed on the die via the probe card, wherein said die comprises an integrated circuit which electrically connects at least one of said certain contact areas to voltage of predetermined value which is internally provided in the die during said testing upon receipt by the die of a predetermined signal.

2. The semiconductor die of claim 1 wherein said circuit comprises an electrical switch and a voltage divider.

3. The semiconductor die of claim 2 wherein the circuit connects each of a plurality of said certain contact areas to voltage of predetermined value, and wherein said voltage divider is a resistive voltage divider.

4. The semiconductor die of claim 3 wherein the voltage divider is configured so that the value of voltage applied to each of the plurality of certain contact areas is the same and wherein the electrical switch is configured so that the plurality of certain contact areas is directly connected to each other.

5. An apparatus for the electrical testing of semiconductor wafers containing multiple dies each of which die has a plurality of contact areas which are contacted by respective probes of a probe card connected to test equipment during said testing, wherein each said die has one or more certain contact areas which are not utilized in the testing and are not in electrical connection with any probe at a time during which electrical testing with the probe card is performed on the wafer, comprising:
    means for providing a predetermined signal to said die; and
    means integrally embodied in said die, responsive to said predetermined signal for electrically connecting at least one of said certain contact areas to voltage internally provided in the die of predetermined magnitude.

6. The apparatus of claim 5 wherein said means for electrically connecting at least one of said certain contact areas to voltage internally provided in the die of predetermined magnitude comprises means for connecting a plurality of said certain contact areas to voltage internally provided in the die of predetermined magnitude.

7. The apparatus of claim 6 wherein said means for connecting a plurality of said certain contact areas to voltage internally provided in the die of predetermined magnitude comprises an electrical switch and a voltage divider.

8. In the electrical testing of semiconductor wafers containing multiple dies each die of which has a plurality of contact areas which are contacted by respective probes of a probe card connected to test equipment during the testing, wherein each die has a plurality of certain contact areas which are not utilized in the testing, a method comprising:
    electrically connecting said plurality of certain contact areas of each die to the same voltage of predetermined value via circuitry integrated in the die which directly connects said plurality of certain contact areas to each other in response to a predetermined signal generated externally of the die.

9. The method of claim 8 wherein said plurality of said certain contact areas comprises two contact areas.

10. The method of claim 9 wherein each of said dies is a double data rate (DDR) type die.

11. A semiconductor die having a plurality of contact areas including one or more certain contact areas which are not utilized when electrical testing is performed on the die, wherein said die comprises an integrated circuit which electrically connects a plurality of said certain contact areas to voltage of predetermined value upon receipt by the die of a predetermined signal, said integrated circuit comprising an electrical switch and a resistive voltage divider, said voltage divider being configured so that the value of voltage applied to each of the plurality of certain contact areas is the same and the electrical switch being configured so that the plurality of certain contact areas are directly connected to each other.

12. The semiconductor die of claim 11 wherein said plurality of certain contact areas comprises two contact areas.

13. The semiconductor die of claim 12 wherein the die is a double data rate (DDR) type die.

14. A system for electrically testing a semiconductor wafer which enhances the number of channels available for testing, comprising:
    a probe card having a plurality of probes each of which corresponds to a testing channel;
    an electrical tester for sending testing signals to the probe card and receiving signals therefrom;
    a semiconductor wafer having multiple dies, each die of which has a plurality of contact areas for contacting said probes during the testing and at least one certain contact area which is not electrically connected to a probe at a time during testing with the probe card but which during said testing is required to be electrically connected to a reference voltage;
    wherein each die further comprises an integrated circuit including a switch for electrically connecting said at least one certain contact area to said reference voltage internally provided in the die during the testing, whereby connection of said at least one certain contact area to said reference voltage through said probe card is not necessary, thus enhancing the number of probes and corresponding testing channels which are utilized for testing.

15. The system of claim 14 wherein said at least one certain contact area comprises a plurality of certain contact areas and wherein said integrated circuit further comprises a voltage divider for connecting each of said plurality of contact areas to said reference voltage.

16. The system of claim 15 wherein said plurality of certain contact areas comprises two certain contact areas and wherein said voltage divider is configured to provide the same reference voltage to each of the certain contact areas.

* * * * *